(12) United States Patent
Ogihara (10) Patent No.: US 8,866,165 B2
(45) Date of Patent: Oct. 21, 2014

(54) LIGHT EMITTING APPARATUS

(75) Inventor: Mitsuhiko Ogihara, Gunma (JP)

(73) Assignee: Oki Data Corporation, Tokyo (JP)

( * ) Notice: Subject to any disclaimer, the term of this patent is extended or adjusted under 35 U.S.C. 154(b) by 433 days.

(21) Appl. No.: 12/923,641

(22) Filed: Sep. 30, 2010

(65) Prior Publication Data

US 2011/0079798 A1    Apr. 7, 2011

(30) Foreign Application Priority Data

Oct. 1, 2009 (JP) .................................. 2009-229728

(51) Int. Cl.

| H01L 29/205 | (2006.01) |
|---|---|
| H01L 33/20 | (2010.01) |
| H01L 33/38 | (2010.01) |
| H01L 33/08 | (2010.01) |
| H01L 33/00 | (2010.01) |
| H01L 33/42 | (2010.01) |
| H01L 25/075 | (2006.01) |
| H01L 33/44 | (2010.01) |

(52) U.S. Cl.
CPC .............. *H01L 33/08* (2013.01); *H01L 33/0079* (2013.01); *H01L 33/42* (2013.01); *H01L 33/20* (2013.01); *H01L 25/0753* (2013.01); *H01L 33/38* (2013.01); *H01L 2224/48091* (2013.01); *H01L 33/44* (2013.01)
USPC .......... 257/91; 257/88; 257/89; 257/E33.064; 257/E33.065

(58) Field of Classification Search
CPC ....................................................... H01L 33/08
USPC ........ 257/89, E33.044, 91, E33.064, E33.065
See application file for complete search history.

(56) References Cited

U.S. PATENT DOCUMENTS

| 7,385,574 B1 * | 6/2008 | Van de Ven et al. ............ 345/82 |
|---|---|---|
| 2008/0063431 A1 * | 3/2008 | Ogihara et al. ................ 399/220 |
| 2009/0242905 A1 * | 10/2009 | Ogihara et al. .................. 257/88 |

FOREIGN PATENT DOCUMENTS

| JP | 3-192779 | 8/1991 |
|---|---|---|
| JP | H11-251634 A | 9/1999 |
| JP | 2006-261359 | 9/2006 |
| JP | 2008-263126 | 10/2008 |

* cited by examiner

*Primary Examiner* — Hsin-Yi Hsieh
(74) *Attorney, Agent, or Firm* — Rabin & Berdo, P.C.

(57) ABSTRACT

A light emitting apparatus includes a plurality of single crystal semiconductor thin films that emit light. The single crystal semiconductor thin films are secured in intimate contact to the surface of a substrate or a bonding layer formed on the substrate. A first conductive electrode is formed on the single crystal semiconductor thin film and is connected to a first conductive side metal layer. The first conductive side metal layer is closer to the surface of the substrate than a top surface of the single crystal semiconductor thin film. A second conductive electrode is formed on the single crystal semiconductor thin film. A second conductive side metal layer is connected to the second conductive electrode. The second conductive side metal layer is closer to the surface of the substrate than the top surface of the single crystal semiconductor thin film.

14 Claims, 10 Drawing Sheets

LIGHT EMITTING APPARATUS

BACKGROUND OF THE INVENTION

Field of the Invention

The present invention relates to a light emitting apparatus formed of a plurality of single crystal semiconductor thin films and capable of outputting light with high light-output efficiency.

Japanese Patent Application Laid-Open No. H11-251634 discloses a structure of a light emitting diode that has been improved in terms of light output efficiency. The light emitting diode includes a thin transparent electrode layered on a light emitting layer, and a metal grid electrode having a plurality of openings formed therein and layered on the thin transparent electrode. This structure provides a large grid spacing of the metal grid electrode while not impairing light-output efficiency of the light emitting layer in the middle of the respective openings.

The above-described structure is advantageous in that use of larger grid spacing reduces the areas of the light emitting layer covered with the metal grid electrode. However, the prior art light emitting diode is configured such that the metal grid electrodes are formed above the light emitting layer and therefore the metal grid electrodes cover part of the upper portion of the light emitting layer. Due to the fact that the metal grid electrode blocks the emitted light directly below the electrodes and the light emitted in directions toward the electrodes, the light-output efficiency is limited.

SUMMARY OF THE INVENTION

The present invention was made in view of the above-described drawbacks.

An object of the invention is to provide a light emitting apparatus capable of outputting light with minimum blockage by the grid electrodes.

A light emitting apparatus includes a plurality of single crystal semiconductor thin films that emit light. The single crystal semiconductor thin films are secured in intimate contact to the surface of a substrate or a bonding layer formed on the substrate. A first conductive electrode is formed on the single crystal semiconductor thin film and is connected to a first conductive side metal layer. The first conductive side metal layer is closer to the surface of the substrate than a top surface of the single crystal semiconductor thin film. A second conductive electrode is formed on the single crystal semiconductor thin film. A second conductive side metal layer is connected to the second conductive electrode. The second conductive side metal layer is closer to the surface of the substrate than the top surface of the single crystal semiconductor thin film.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

The present invention will be described with reference to FIGS. 1A-11B. These figures are mainly intended to illustrate the features of the invention, and are not necessarily drawn to scale. Similar elements have been given the same reference numerals. Embodiments of the present invention will be described with reference to the accompanying drawings.

First Embodiment

Figure 1A:
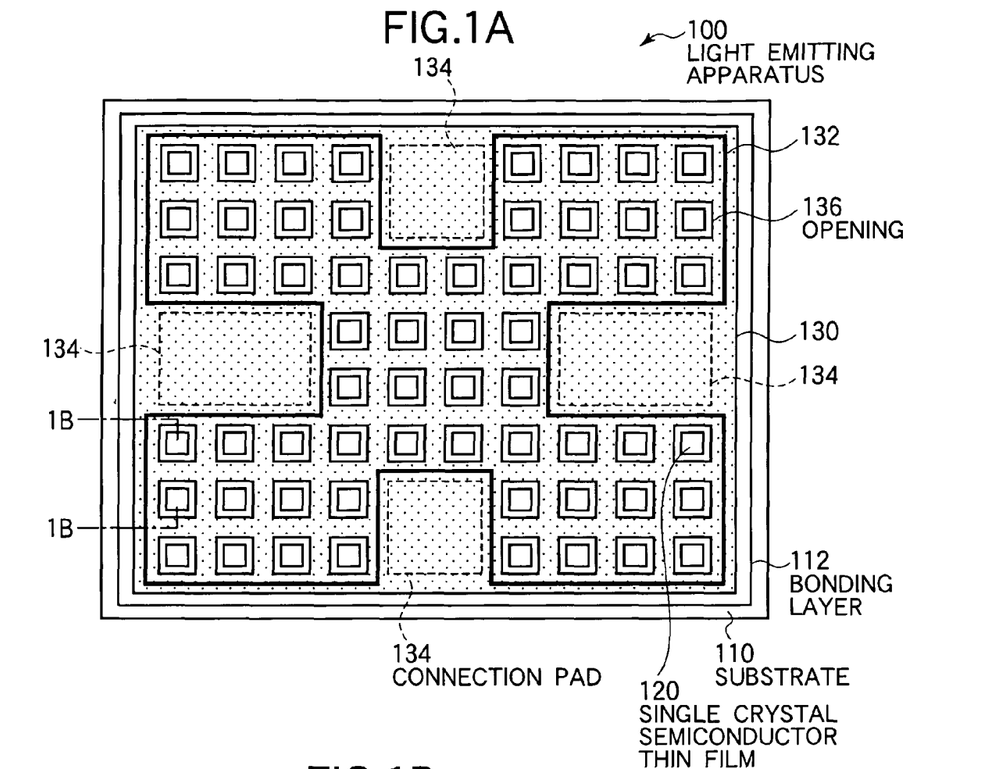
FIG. 1A is a top view of the light emitting apparatus.
Figure 1B:
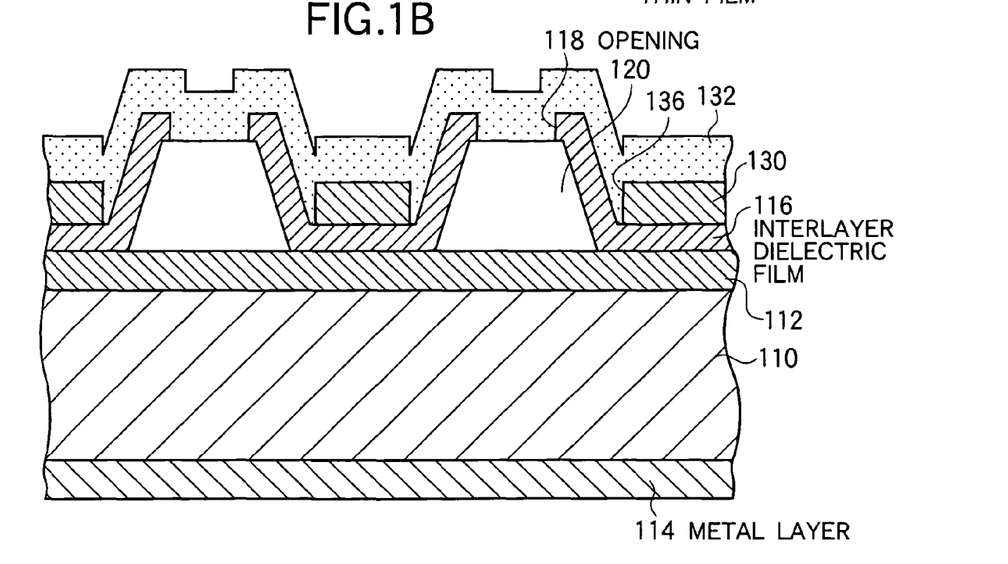
FIG. 1B is a cross-sectional view taken along a line 1B-1B of FIG. 1A.

A first embodiment will be described with reference to FIGS. 1A-7B. The configuration and operation of a light emitting apparatus 100 according to the first embodiment will be described with reference to FIGS. 1A and 1B. FIG. 1A is a top view of the light emitting apparatus 100 and FIG. 1B is a cross-sectional view taken along a line 1B-1B of FIG. 1A. FIGS. 1A and 1B are intended to illustrate only the features of the first embodiment and not to limit the dimensional relations of the respective parts in the figures.

Referring to FIGS. 1A and 1B, the light emitting apparatus 100 includes a plurality of single crystal semiconductor thin films 120 in intimate contact with the surface of a bonding layer 112 formed on a substrate 110, a common wiring 130 formed on the surface of a transparent interlayer dielectric film 116 in areas except for the single crystal semiconductor thin films 120, and a first electrode 132 formed in contact with the upper surfaces of the single crystal semiconductor thin films 120 via openings 118 formed in the interlayer dielectric film 116. The interlayer dielectric film 116 may also be formed of a material opaque to the light emitted from the light emitting portion of the single crystal semiconductor thin film. The first electrode 132 is transparent to the light emitted from the single crystal semiconductor thin film. Electrical connection is made between the light emitting apparatus 100 and a control apparatus (not shown) outside the light emitting apparatus 100 by means of connection pads 134. A metal layer 114 is formed on the back surface of the substrate 100 to serve as a ground electrode of the light emitting apparatus 100. The bonding layer 112 or metal layer 114 may serve as a second electrode of the light emitting apparatus 100. Major elements of the light emitting apparatus 100 will be described below.

{Substrate 110}

A substrate 110 may be implemented with a metal substrate formed of a material selected from the group consisting of steel, aluminum, brass, nickel, iron, and stainless steel; a ceramic substrate including an aluminum nitride substrate (AlN) and an aluminum oxide substrate; a semiconductor substrate including an SiC substrate and an Si substrate; an insulating substrate including a diamond-like carbon (DLC) substrate and a diamond substrate; or a plastic substrate.

For purposes of illumination, the light emitting elements are required to have good heat dissipation performance, i.e., high heat conductivity of the substrate. For this purpose, a highly heat conductive substrate, for example, a semiconductor substrate or an insulating layer may be conveniently used.

It is preferable that the single crystal semiconductor thin film can be secured either to the substrate 110 in intimate contact therewith or to the bonding layer 112 formed on the substrate 110, without using a bonding agent such as paste or solder directly. For this purpose, the substrate 110 may preferably have a flatness of less than 10 nm. Specifically, the substrate 100 should have a peak-to-valley roughness, $R_{PV}$, smaller than 10 nm, and more preferably smaller than 3 nm for further improvement of intimate contact between bonded surfaces.

{Bonding Layer 112}

The bonding layer 112 is layered on the surface of the substrate 110 having a peak-to-valley roughness less than 10 nm. The bonding layer 112 preferably has a surface having a peak-to-valley roughness less than 10 nm. The bonding layer 112 has a single layer structure formed of a material that contains at least one element selected from the group consisting of Au, Ge, Ni, Al, Ti, Pd, Cu, Cr, and Pt, or a multi layer structure of layers formed of different materials or different compositions.

The bonding layer 112 may be formed by sputtering, vapor deposition, chemical vapor deposition (CVD), or plating. If the bonding layer 112 is to have a multi-layered structure, two or more of the above-described methods may be combined as required.

If the bonding layer 112 formed by one of the above-described methods has a surface having a peak-to-valley roughness less than 10 nm, no further planarization process is required. The bonding layer 112 may be subjected to a planarization process such as chemical mechanical polishing (CMP), electrolytic polishing, or sputtering, in order to polish the surface of the bonding layer 112 to a roughness less than 10 nm. If the bonding layer 112 is to have a multi layer structure of different metal materials, one of the metal layers may be subjected to CMP for planarization.

The bonding layer 112 may be a layer of an inorganic dielectric film (e.g., AlN, $Al_2O_3$, $SiO_2$, SiN, SiON, phosphor silica glass (PSG), or boron silicate glass (BSG)), an organic material layer (e.g., polyimide), an inorganic/organic glass layer (e.g., Spin On Glass, or SOG), an insulating layer (e.g., DLC and polycrystalline diamond), or, a semiconductor layer (e.g., Si or SiC).

For applications where light emitting elements need to have good heat dissipation performance, it is desirable that the bonding layer 112 is formed of a material having high heat conductivity. Such materials include a metal layer, an inorganic dielectric material layer, an insulating material layer (DLC or polycrystalline diamond), and a semiconductor layer (e.g., Si and SiC).

The single crystal semiconductor thin film 120 includes a light emitting layer. The single crystal semiconductor thin film 120 is an epitaxially grown semiconductor layer. The semiconductor epitaxially grown layer is first formed on a support or base substrate, and is then released from the support substrate, and is finally bonded to the substrate 110. The surface of the bonding layer 120 in contact with the substrate 110 has a peak-to-valley roughness of at least less than 10 nm.

{Single Crystal Semiconductor Thin Film 120}

It is preferable that the single crystal semiconductor thin film 120 is first released from the growth substrate and then directly secured to the bonding layer 112 in intimate contact without using a bonding agent or a solder. The releasing of the single crystal semiconductor thin film 120 from the growth substrate and the bonding of the single crystal semiconductor thin film 120 to the bonding layer 112 will be described later. For applications where the light emitting elements need to have good heat dissipation performance, the bonding surfaces are preferably bonded in intimate contact.

The light emitting apparatus 100 has a plurality of single crystal thin films 120 bonded to the bonding layer 112 as shown in FIG. 1A. The single crystal semiconductor thin films 120 bonded to the bonding layer are electrically isolated from one another.

In order to implement a large light emitting area by using the light emitting apparatus 100, it is preferable to increase the number of light emitting portions rather than to increase the size of each light emitting portion. The size of the light emitting apparatus 100 is selected to be smaller than, for example, the typical minimum size (300 µm×300 µm) of a bare chip of a conventional light emitting diode formed on a support or base substrate. The plurality of single crystal semiconductor thin films 120 are arranged to occupy a desired total area of the light emitting region.

Thus, a large light emitting area may be implemented with the single crystal semiconductor thin films 120 arranged at larger intervals. Conversely, a small light emitting area may be implemented with reduction of both the size of the light emitting portions and the intervals at which the light emitting portions are arranged.

For example, if the light emitting portions have a size of 100 µm square and have their centers regularly spaced with a pitch of 200 µm, then the size of the light emitting apparatus 100 shown in FIG. 1A would be 1.9×1.9 mm, which is a large light emitting area.

If the light emitting portions have a size of 10 µm square and have their centers regularly spaced with a pitch of 20 µm, then the size of the light emitting apparatus 100 shown in FIG. 1A would be 150×150 µm, which is a small light emitting area.

Since the single crystal semiconductor thin film 120 according to the first embodiment is formed only of an epitaxial layer, a film thickness of less than 10 µm may be achieved.

An exemplary configuration of the single crystal semiconductor thin film 120 will be described. The single crystal semiconductor thin film 120 has a multi layer structure of single crystal semiconductor layers which are grown on a growth substrate by, for example; metal organic chemical vapor deposition (MOCVD) or molecular beam epitaxy (MBE).

A GaAs substrate may be used as a growth substrate if the single crystal semiconductor thin film 120 has a multilayer structure of AlGaInP single crystal semiconductor. A sapphire substrate, a GaN substrate, or a SiC substrate may be used as a growth substrate if the single crystal semiconductor thin film 120 is a nitride semiconductor thin film.

Figure 2A:
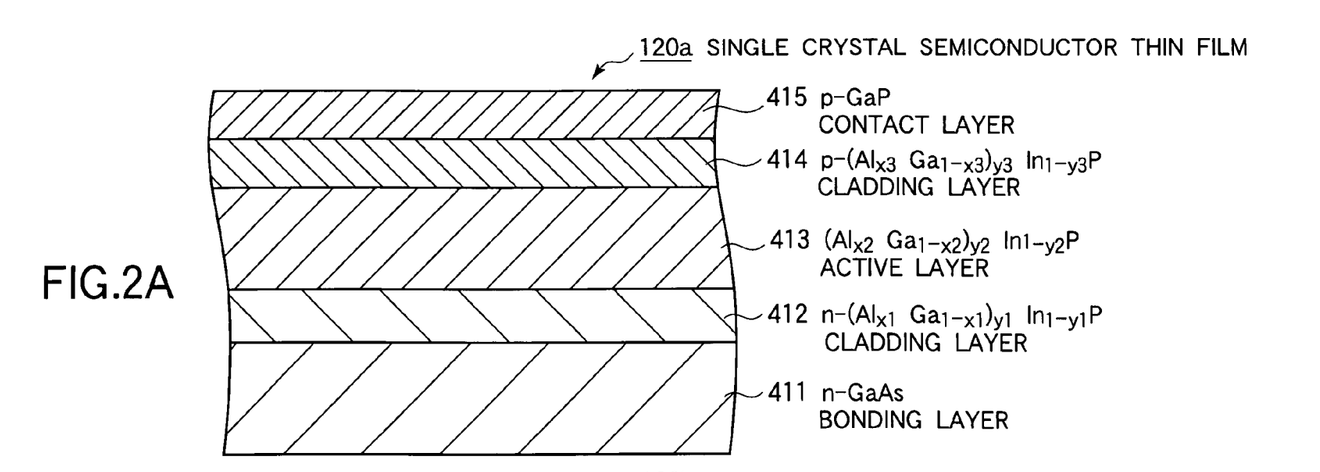
FIG. 2A illustrates a single crystal semiconductor thin film formed of AlGaInP.

FIG. 2A illustrates a single crystal semiconductor thin film 120a, which is an exemplary light emitting diode formed of AlGaInP and emits red light. The single crystal semiconductor thin film 120a includes the following layers: an n-type GaAs bonding layer 411, an n-type $(Al_{x1}Ga_{1-x1})_{y1}In_{1-y1}P$ ($1 \geq x1 \geq 0$, $1 \geq y1 \geq 0$) cladding layer 412, a $(Al_{x2}Ga_{1-x2})_{y2}In_{1-y2}P$ ($x1 > x2$, $y2 \geq y1$, $x3 > x2$, $y3 \geq y1$) active layer 413, a p-type $(Al_{x3}Ga_{1-x3})_{y3}In_{1-y3}P$ ($1 \geq x3 \geq 0$, $1 \geq y3 \geq 0$) cladding layer 414, and a p-type GaP contact layer 415 in this order.

The active layer 413 may have a single quantum well (SQW) structure or a multi quantum well (MQW) structure, in which case a non-doped $(Al_{x2}Ga_{1-x2})_{y2}In_{1-y2}P$ layer (active layer) ($x1 > x2$, $y2 \geq y1$, $x3 > x2$, $y3 \geq y1$) serves as a quantum well layer and a non-doped $(Al_tGa_{1-t})_sIn_{1-s}P$ layer ($t > x2$, $y2 \geq s$) serves as a barrier layer.

Figure 2B:
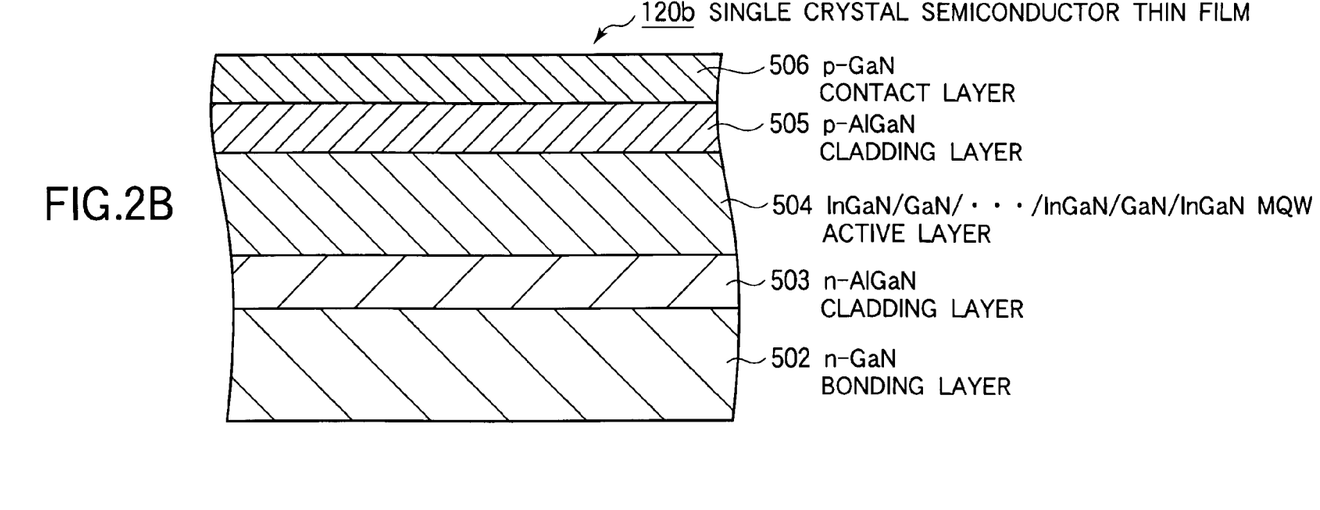
FIG. 2B illustrates an exemplary configuration of the single crystal semiconductor thin film in the form of a nitride semiconductor thin film.

FIG. 2B illustrates an exemplary configuration of a single crystal semiconductor thin film 120b in the form of a nitride semiconductor thin film. The single crystal semiconductor thin film 120b includes the following layers: an n-type GaN bonding layer 502, an n-type. AlGaN cladding layer 503, an InGaN/GaN-MQW active layer 504, a p-type AlGaN cladding layer 505, and a p-type, GaN contact layer 506 which are layered in this order. The n-type AlGaN cladding layer 503 may be omitted. An n-type AlN layer may also be formed under the n-type GaN bonding layer 502.

{Common Wiring 130}

Figure 6:
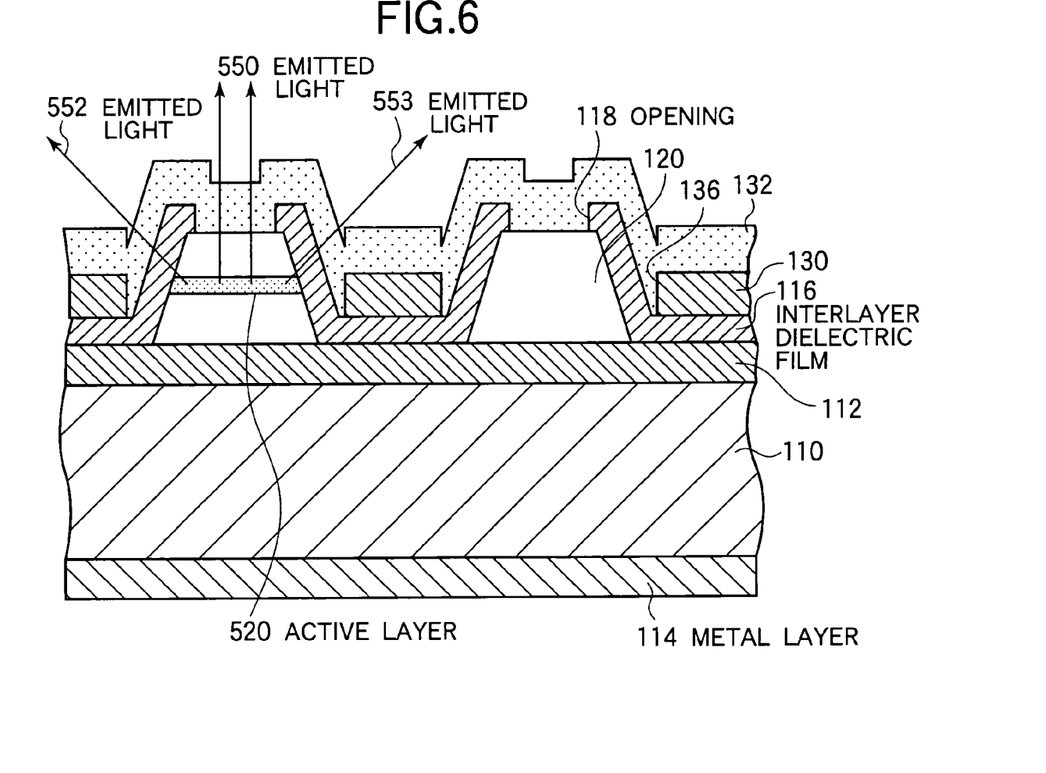
FIG. 6 illustrates the light emitted from the active layer.

Referring to back to FIGS. 1A and 1B, the common wiring 130 is a metal layer electrically continuous to the first electrode 132 of each of the single crystal semiconductor thin films 120 having a light emitting portion (FIG. 6). The common wiring 130 has openings 136 formed therein at the locations where the single crystal semiconductor thin films 120 are located. If the interlayer dielectric film 116 is formed of a material opaque to the light emitted from the light emitting portion, the uppermost surface of the common wiring 130 is set to be lower than the top surface of the single crystal semiconductor thin films 120, so that the common wiring 130 will not block the light emitted from the single crystal semiconductor thin films 120. If the interlayer dielectric film 116 is formed of a material transparent to the light emitted from the light emitting portion, the uppermost surface of the common wiring 130 is set to be lower than the top surface of the light emitting portion (depicted at 520 in FIG. 6), so that the common wiring 130 will not block the light emitted from the single crystal semiconductor thin films 120.

Referring to FIG. 1B, the interlayer dielectric film 116 is formed to cover at least a part of the top surfaces and the entire side surfaces of the single crystal semiconductor thin films 120. This prevents the first electrode, which is electrically connected to the common wiring 130, from short-circuiting a first conductivity type semiconductor thin film and a second conductivity type semiconductor layer which are both exposed to the side surfaces of the single crystal semiconductor thin film 120.

Figure 4A:
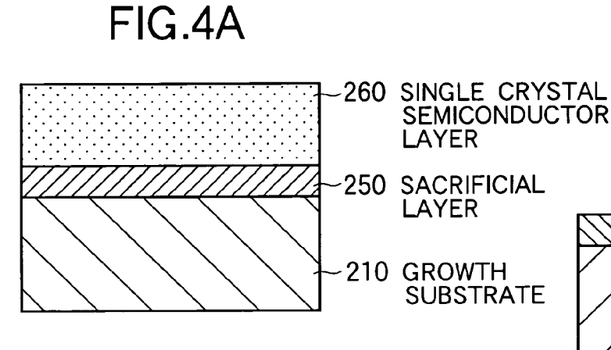
FIGS. 4A-4E illustrate the manufacturing steps of the light emitting apparatus.
Figure 4B:
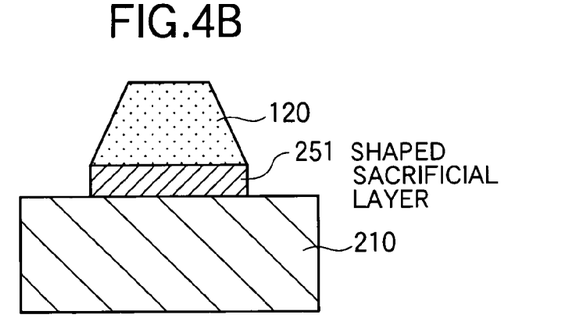

The single crystal semiconductor thin film 120 has side surfaces in the shape of a trapezoid as shown in FIG. 4B illustrating a mesa etching process of the single crystal semiconductor thin film 120. The trapezoidal side surfaces are effective in improving output efficiency of light in directions at angles with a direction normal to the top surface of the single crystal semiconductor thin film 120 and in improving the step coverage effect of the interlayer dielectric layer 116.

A second electrode (e.g., second conductive side electrode) is a metal layer that implements a low resistance contact, preferably ohmic contact, between the bonding surface of the bonding layer 112 and the bonding surface of the single crystal semiconductor thin film 120, in which case the bonding layer 112 may be used as the second electrode.

Thus, the bonding layer 112 may be used as a second electrode. If the single crystal semiconductor thin film 120 has a bonding surface formed of an n-type GaAs layer, the uppermost layer of the bonding layer 112 may be implemented with an alloy that contains one selected from the group consisting of Au, Ge, and Ni or with a stacked layer structure of Ge/N, thereby implementing ohmic contact between the bonding surface of the single crystal semiconductor thin film 120 and the bonding surface of the bonding layer 112. If the single crystal semiconductor thin film 120 has a bonding surface formed of a p-type GaAs layer, the surface of the bonding layer 112 may be a metal layer that contains Al, thereby implementing ohmic contact between the bonding surface of the single crystal semiconductor thin film 120 and the bonding surface of the bonding layer 112.

If the single crystal semiconductor thin film 120 has a bonding surface formed of an n-type GaN, the surface of the bonding layer 112 may have a stacked layer structure of a Ti layer and an Al layer, thereby implementing ohmic contact between the boding surface of the single crystal semiconductor thin film 120 and the bonding surface of the bonding layer 112.

{First Electrode 132}

The first electrode 132 is an electrode for the single crystal semiconductor thin film 120. The first electrode 132 is preferably transparent to the wavelengths of the light emitted from the light emitting region of the single crystal semiconductor thin film 120. Thus, the first electrode 132 may be implemented with an ITO film or a ZnO film.

The first electrode 132 may be a single thin film that serves as the common electrodes for single crystal semiconductor thin films 120 shown in FIG. 1A. The first electrode 132 makes a low resistance contact with the top surfaces of all single crystal semiconductor thin films 120, and with the common wiring 130.

Therefore, the first electrode 132 extends generally in a flat plane, having a large area in direct contact with the common wiring 130. This implies that the first electrode 132 makes a sufficiently low resistance contact with the common wiring 130.

In this specification, the fact that the first electrode 132 makes a low resistance contact with the semiconductor implies that the contact resistance is lower than at least the sheet resistances of the first electrode 132 and the sheet resistance of the semiconductor, so that the voltage drop across the contact is lower than that in the first electrode or the semiconductor layer. Likewise, in this specification, the fact that the first electrode 132 makes a low resistance contact with the common wiring 130 implies that the contact resistance is lower than the sheet resistances of the first electrode 132 and the sheet resistance of the common wiring 130, so that the voltage drop across the contact is lower than that in the first electrode 132 or the common wiring 130.

The connection pads 134 are part of the common wiring 130 and are used for electrically connecting the light emitting apparatus 100 to an external power supply by, for example, wire bonding. The size of the connection pad 134 may be designed appropriately according to the manner in which electrical connection is made.

The connection pad 134 can have a sheet resistance in the range of 50 µm☐ to 100 µm☐ if electrical connection to the external circuit is made by a bonding wire. Though not shown in FIG. 8, the substrate 110 may be implemented with an electrically conductive substrate, for example, a metal substrate or a semiconductor substrate (i.e., low resistance semiconductor substrate) so that the electrical connection between the bonding layer 112 and the external power supply may be made via the back surface of the substrate 110.

Referring to FIG. 1B, the interlayer dielectric film 116 has openings 118 through which the single crystal semiconductor thin films 120 are exposed, and covers the side surfaces of the single crystal semiconductor thin film 120 and the bonding layer 112. The first electrode 132 which is a transparent electrode is formed on the interlayer dielectric film 116, and is connected to the surfaces of the single crystal semiconductor thin films 120 via the openings 118. The metal layer 114 is formed on the back surface of the substrate 100 for electrical connection between the bonding layer 112 and the external power supply. The metal layer 114 may be formed of, for example, Al if the substrate 110 is implemented with a semiconductor substrate (e.g., Si substrate), but may be omitted if the substrate 110 is implemented with a metal substrate, for example, a Cu substrate.

Illumination apparatus 300 and 400 that employ the light emitting apparatus 100 will be described with reference to FIGS. 3A and 3B.

Figure 3A:
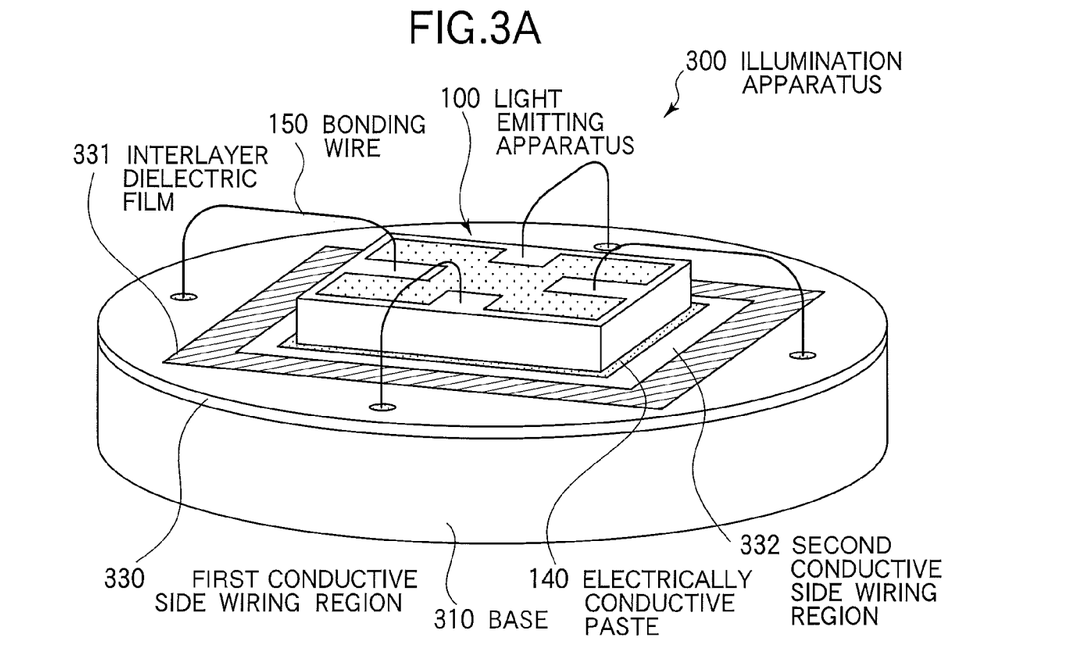
FIG. 3A is a perspective view illustrating an illumination apparatus that employs the light emitting apparatus.

FIG. 3A is a perspective view illustrating the illumination apparatus 300 that employs the light emitting apparatus 100. A base 310 includes wires and circuit components through which an external apparatus supplies control signals to drive the illumination apparatus 300.

The circuit components in the base 310 constitute a circuit that controls the illumination apparatus 300. The circuit supplies control signals and the power supply voltage to various portions of the illumination apparatus 300.

The base 310 includes a variety of wirings for electrically connecting the base 310 and the external power supply together. The wirings include, for example, thin film wirings, bonding wires such as Au, and electrical wires and cables covered with insulation material.

Specific circuit components and wires may be selected and designed as required, and may also be located outside the base 310, in which case the external circuits and the base 310 may be interconnected by means of cables or wires.

In order for the illumination apparatus 300 to have good heat dissipation performance, the base 310 is preferably implemented with ceramics or metal, for example, AlN, Cu, or Al whose heat conductivity is good.

Referring to FIG. 3A, the illumination apparatus 300 includes a second conductive side wiring region 332 via which the control signals are received from the external powder supply. As shown in FIGS. 2A and 2B, if the upper surface of the single crystal semiconductor thin film 120 is to be a p-type and the lower surface is to be an n-type, the second conductive side wiring region 332 is an n-type wiring region and a first conductive side wiring region 330 is a p-type wiring region.

An interlayer dielectric layer 331 is formed between the second conductive side wiring region 332 and the first conductive side wiring region 330 or between the second conductive side wiring region 332 and the base 310. The light emitting apparatus 100 is mounted on the base 310 with an electrically conductive paste layer 140 between the surface of the substrate 110 and the base 310 if the metal layer 114 is not employed, or between the surface of the metal layer 114 and the base 310 if the metal layer 114 is employed. The connection pads 134 are connected to the first conductive side wiring region 330 by means of an Au bonding wire 150.

Though not shown, the illumination apparatus 300 may have screw-based connections as required in addition to the configuration shown in FIG. 3A. Also, a glass cover or a plastic cover may be placed over the illumination apparatus 300 to protect the inner components or to prompt the diffusion of light.

Figure 3B:
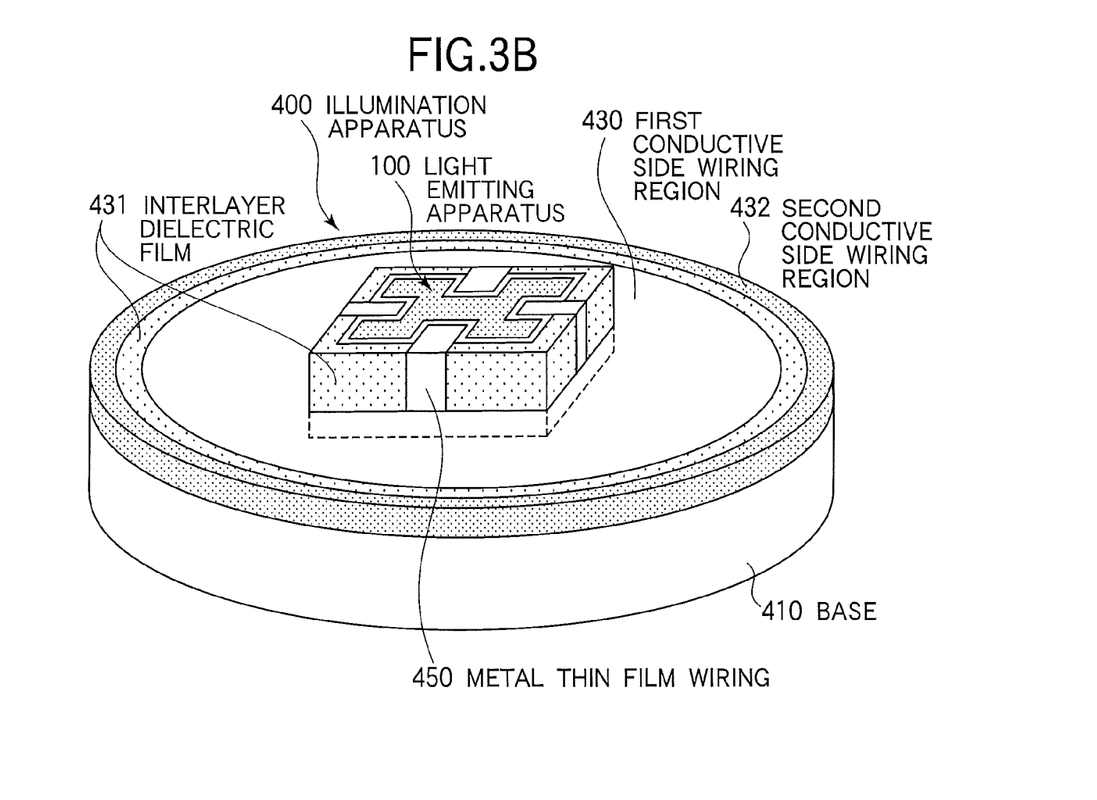
FIG. 3B is a perspective view illustrating an illumination apparatus that employs the light emitting apparatus.

FIG. 3B is a perspective view illustrating the illumination apparatus 400 that employs the light emitting apparatus 100. The illumination apparatus 400 includes a second conductive side wiring region 432, a first conductive side wiring region 430, and an interlayer dielectric layer 431 formed on a base 410. The light emitting apparatus 100 is mounted on the base 410 with an electrically conductive paste between the back surface of the light emitting apparatus 100 and the base 410, so that the light emitting apparatus 100 is electrically connected to the second conductive side wiring region 432. The connection pads 134 on the upper surface of the light emitting apparatus 100 is connected to a first conductive side wiring region 430 by means of a metal thin film wiring 450. The metal thin film wiring 450 is implemented with, for example, plating, which can eliminate the wire bonding process. The illumination apparatus 400 emits light when voltage is applied across the second conductive side wiring region 432 and the first conductive side wiring region 430 to supply current through the light emitting apparatus 100.

{Method for Manufacturing Illumination Apparatus}

The method for manufacturing the light emitting apparatus 100 according to the first embodiment will be described with reference to FIGS. 4A-4E and 1A-1B. FIGS. 4A-4E illustrate the manufacturing steps of the light emitting apparatus 100, from a step in which the single crystal semiconductor thin films 120 are formed on a growth substrate 210 to a step in which the single crystal semiconductor thin films 120 are bonded to a host substrate 110.

FIG. 4A illustrates a step in which a sacrificial layer 250 is formed on the growth substrate 210 and a single crystal semiconductor layer 260 is then grown epitaxially on the sacrificial layer 250.

FIG. 4B illustrates a step in which the single crystal semiconductor layer 260 and the sacrificial layer 250 are mesa-etched into trapezoidal islands, thereby forming a single crystal semiconductor thin films 120 and shaped sacrificial layers 251. FIG. 4B shows only one of the islands. It is to be noted that the shaped sacrificial layer 251 is exposed in FIG. 4B.

Figure 4C:
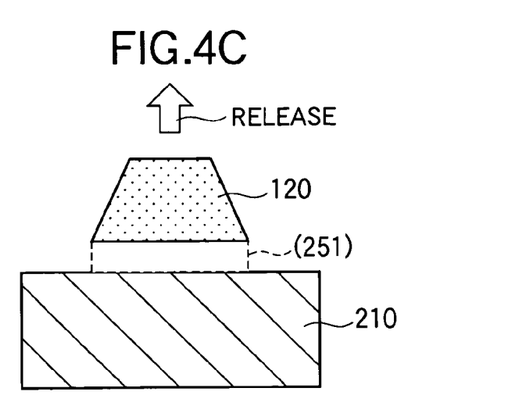

FIG. 4C illustrates a step in which only the shaped sacrificial 251 is etched away, thereby releasing the single crystal semiconductor thin film 120 from the growth substrate 210.

Figure 4D:
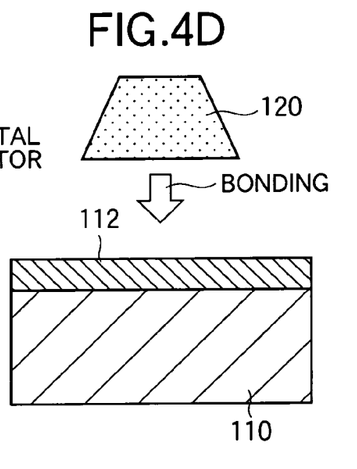
Figure 4E:
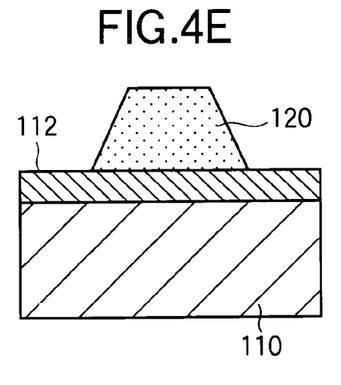

FIGS. 4D and 4E illustrate a step in which the single crystal semiconductor thin film 120 is directly bonded under heat and pressure in an intimate contact with the bonding layer 112 formed on the substrate 110.

As shown in FIG. 1B, the interlayer dielectric film 116 (e.g., SiN) is formed on the single crystal semiconductor thin films 120 bonded to the bonding layer 112 on the substrate 110 by plasma chemical vapor deposition (P-CVD). A metal thin film formed of, for example, Ti/Pt/Au is then formed by electron beam (EB) vapor deposition. The metal thin film is then patterned into the common wiring 130 by standard lift-off method. Next, the interlayer dielectric film 116 is patterned by common photolithography and dry-etching to form contact openings 118 through which the single crystal semiconductor thin films 120 are exposed. A transparent electrode material (e.g., ITO film or ZnO film) is formed by a well-known method, for example, sputtering. The first electrode 132 as shown in FIG. 1A is then formed by standard photolithography and dry etching. Then, the metal layer 114 is formed on the back surface of the substrate 110 to make electrical connection with the external power supply. This completes the light emitting apparatus 100. If the substrate 110 is to be implemented with a semiconductor, e.g., Si substrate, the metal layer 114 may be formed of Al. If the substrate 110 is to be implemented with a metal substrate, e.g., Cu, this step may be omitted.

Figure 5:
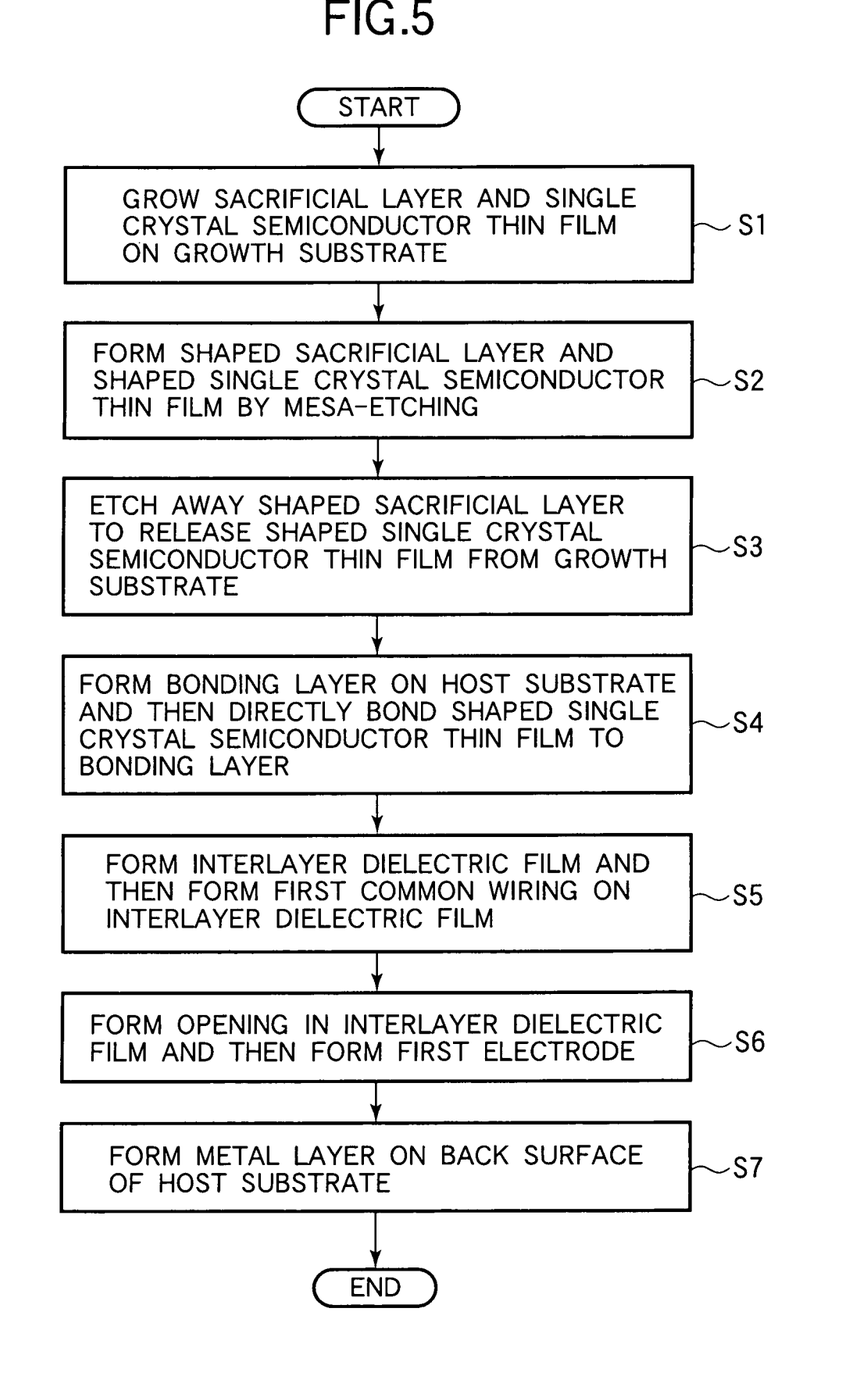
FIG. 5 is a flowchart illustrating the manufacturing processes of the light emitting apparatus.

FIG. 5 is a flowchart illustrating the manufacturing processes of the light emitting apparatus 100. The manufacturing processes will be described with reference to FIGS. 4A-4E and FIG. 5.

S1: The sacrificial layer and the single crystal semiconductor layer may be crystal grown on the surface of the growth substrate.

S2: The sacrificial layer and the single crystal semiconductor thin films are formed by mesa etching, thereby obtaining shaped sacrificial layer and shaped the single crystal semiconductor thin films.

S3: The shaped sacrificial layer is etched away to release the single crystal semiconductor thin film from the growth substrate.

S4: The bonding layer is formed on the substrate, and the single crystal semiconductor thin film is then bonded directly to the bonding layer with the released surface in direct contact with the bonding layer.

S5: The interlayer dielectric film 116 is formed on the bonding layer 112 and the common wiring 130 is formed on the interlayer dielectric film 116.

S6: The openings 136 are formed in the interlayer dielectric film 116 at locations above the first conductive side of the single crystal semiconductor thin film 120, and the first electrode 132 is then formed on the common wiring 130 and the top surface of the single crystal semiconductor thin film 120.

S7: The metal layer is formed on the back surface of the substrate.

{Operation}

The operation of the single crystal semiconductor thin film 120, which includes the active layer 520 having an upper surface of a p-type conductive side and a lower surface of an n-type conductive side, will be described.

The bonding layer 112 is implemented with a metal substrate and the substrate 110 is implemented with a metal substrate. The back surface of the substrate 110 or the metal layer 114 is connected to the ground, in which case the metal layer 114 may be used as the second common electrode. A positive potential is applied via the connection pads 134. (FIG. 1A) to the common wiring 130. The common wiring 130 has a sufficiently low resistance so that no significant voltage drop is developed when the operation current flows through the single crystal semiconductor thin film 120. Thus, all of the single crystal semiconductor thin films 120 are driven simultaneously by a substantially equal amount of current.

The common wiring 130 is formed in an area in which the active layers 520 or the single crystal semiconductor thin films 120 are absent. The first electrode 132, which is a transparent electrode, electrically connects the upper surfaces of the single crystal semiconductor thin films 120 and the common wiring 130.

The height of the common wiring 130 above the substrate 110 is smaller than that of the top surface of the active layer 520. The top surface is on a side of the active layer 520 opposite the interlayer dielectric layer 112. Therefore, the common wiring 130 will not block the light 550 in a direction normal to the upper surface of the single crystal semiconductor thin film 120 and the light 552 and 553 in directions at angles with the direction normal to the upper surface of the single crystal semiconductor thin film 120.

FIG. 6 illustrates the light 552 and 553 emitted from the active layer 520 in a direction normal to the surface of the interlayer dielectric layer 112 and the light 550 in directions at acute angles with the a direction normal to the upper surface of the single crystal semiconductor thin film 120. The interlayer dielectric film 116 is transparent to the light emitted from the active layer 520. Since the top surface of the active layer 520 above the substrate 110 is higher than that of the common wiring 130 (i.e., the upper surface of the common wiring 130 is closer to the substrate 110 than the top surface of the active layer 520), the light 552 and 553 is not blocked by the common wiring 130. The common wiring 130 has openings 136 formed therein through which the respective single crystal semiconductor thin films 120 are exposed, preventing the first electrode 132 from producing voltage drop. The single crystal semiconductor thin film 120 have a thickness less than 10 μm and are secured directly to the bonding layer in intimate contact therewith without using a bonding agent. Therefore, the first electrode 132, which is a transparent electrode, can produce good step coverage of the sidewalls of the single crystal semiconductor thin films 120.

As described above, the first embodiment provides a light emitting apparatus capable of outputting light with high light outputting efficiency while the emitted light in the direction normal to the top surface of the single crystal semiconductor thin films and in directions at angles with the direction normal to the upper surface of the single crystal semiconductor thin film 120 is not significantly blocked by the common wiring 130 formed of metal.

Modification #1-1

Figure 7A:
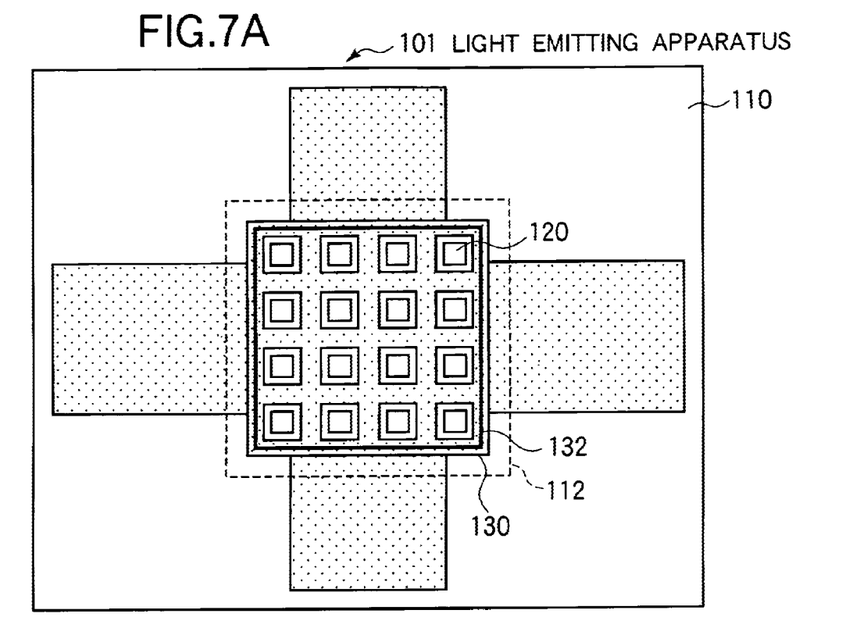
FIG. 7A illustrates a first modification to the first embodiment.

FIG. 7A illustrates a light emitting apparatus 101. The first electrode 132, which is a transparent electrode for the light emitting apparatus 101, may be formed first and the common wiring 130 may then be formed on the first electrode 132.

Modification #1-2

Figure 7B:
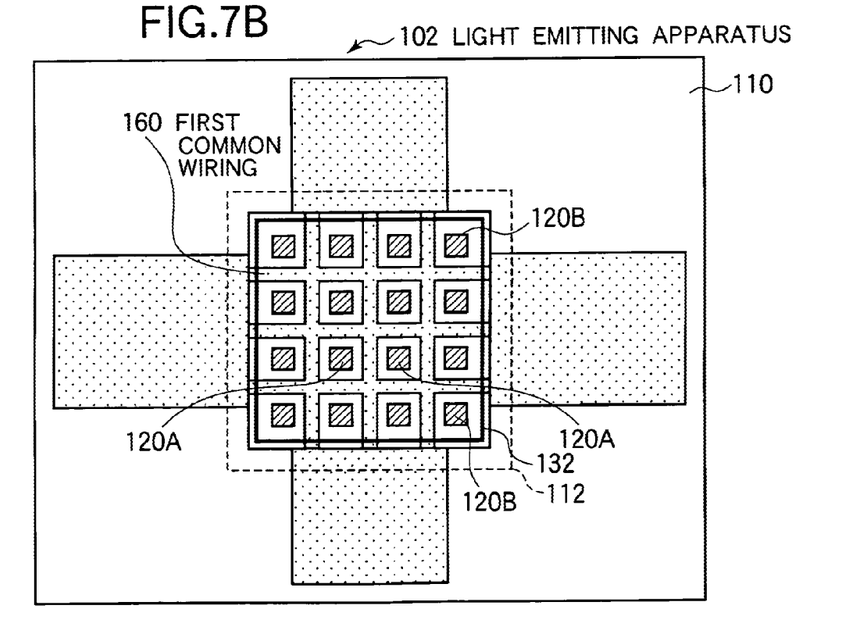
FIG. 7B illustrates a second modification to the first embodiment.

FIG. 7B illustrates a light emitting apparatus 102. A common wiring 160 completely surrounds inner single crystal semiconductor thin films 120A but surrounds outermost single crystal semiconductor thin films 120B only partially.

Modification #1-3

Though not shown, if the substrate 110 is formed of an insulating material, e.g., a ceramic substrate or a glass substrate, the electrode contacts for the first and second conductive sides of the single crystal semiconductor thin film 120 can be formed on one side of the substrate 110, in which case the respective second conductive side contacts may be connected to a first conductive side common wiring, and the first conductive side contacts may be connected to the transparent electrode and a second conductive side common wiring.

In the modification #1-3, the bonding layer 112 to which the single crystal semiconductor thin film 120 is bonded may be formed of an insulating material instead of an electrically conductive material, so that the single crystal semiconductor thin film 120 is electrically isolated from the substrate 110. When the insulating bonding layer 112 is formed of an electrically conductive material, if high heat dissipation performance is required, a thin film material having high heat conductivity is preferably used. In other words, the bonding layer may be conveniently formed of a highly heat conductive thin film material, for example, AlN, $Al_2O_3$, SiN, or DLC.

Second Embodiment

Figure 8:
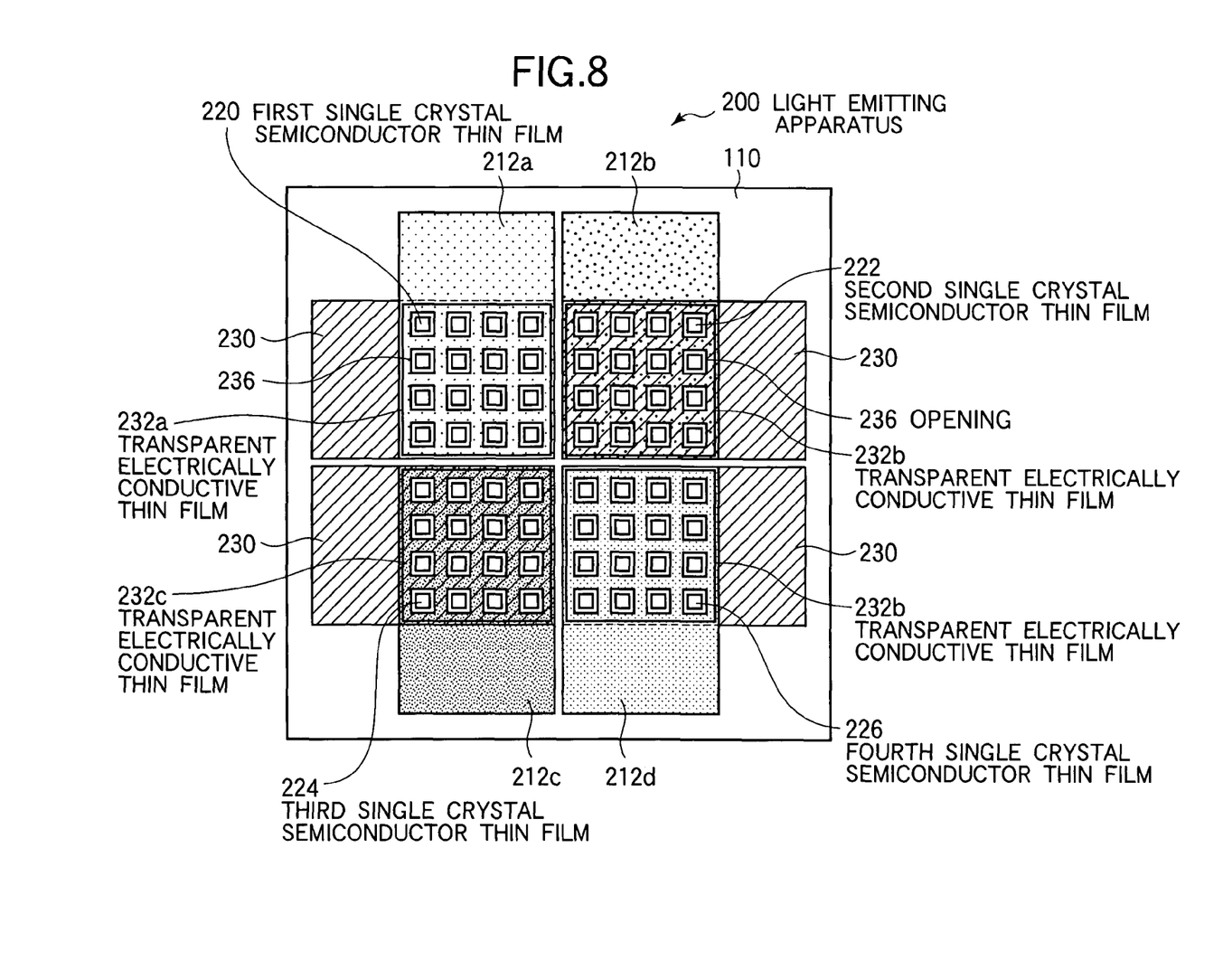
FIG. 8 is a top view illustrating the configuration and operation of a light emitting apparatus according to the second embodiment.

A second embodiment will be described with reference to FIGS. 8-11B. FIG. 8 is a top view illustrating the configuration and operation of a light emitting apparatus 200 according to the second embodiment.

The first embodiment is configured such that the single crystal semiconductor thin films have first and second conductive side contacts connected to their corresponding common wirings and emit light having substantially the same wavelength. The second embodiment differs from the first embodiment in that a light emitting apparatus 200 includes a plurality of groups of single crystal semiconductor thin films and each group emits light having different wavelengths from the remaining groups. Each group includes single crystal semiconductor thin films having first and second conductive side contacts connected to their corresponding common wirings. The single crystal semiconductor thin films in each group emit light having substantially the same wavelength.

FIG. 8 illustrates the light emitting apparatus 200 including four groups of single crystal semiconductor thin films 220, 222, 224, and 226.

For example, the first group 220 emits red light, the second and third groups 222 and 224 emit green light, and the fourth group 226 emits blue light. The AlGaInP semiconductor material (FIG. 2A) may be used to produce red light and the nitride semiconductor material (FIG. 2B) may be used to produce green light and blue light.

Bonding layer 112 (not shown) formed of metal material may be bonded to either a single layer or multiple layers, at least one element selected from the group consisting of Au, Ge, Ni, Ti, Al, Pd, and Au may be contained in the single layer and each of the multiple layers. The bonding layer 112 formed of a metal material also serves as a second common wiring. A common wiring 230 shown in FIG. 8 extends from the bonding layer 112 to the surface of the substrate 110 for making electrical connection to an external power supply and circuits. The common wiring 230 is connected to, for example, the ground potential. The height of the common wiring 230 above the substrate 110 is smaller than the upper surface of the active layer 520 of the first to fourth single crystal semiconductor thin films (i.e., the upper surface of the common wiring 230 is closer to the substrate 110 than the upper surface of the active layer 520 of the first to fourth single crystal semiconductor thin films).

Referring to FIG. 8, the first to fourth groups 220, 222, 224, and 226 have sub common wirings 212a, 212b, 212c, and 212d, respectively. The sub common wirings 212a, 212b, 212c, and 212d are electrically isolated from one another and apply different drive voltages to the first to fourth groups, which in turn emit light having different wavelengths from one another.

Just as in the first embodiment, the sub common wirings 212a-212d have openings 236 formed therein. Each sub common wiring is formed of a metal material selected from the group consisting of, for example, Al, Ni, Pt, Au and Ti. Positive potentials are applied to the sub common wirings 212a-212d. The height of the sub common wirings 212a-212d above the substrate is smaller than the upper surface of the single crystal semiconductor thin films in the first to fourth groups (i.e., the upper surface of the sub common wirings 212a-212d are closer to the substrate 110 than the upper surface of the single crystal semiconductor thin films in the first to fourth groups).

An interlayer dielectric film (not shown) covers the side surfaces of the respective single crystal semiconductor thin films to isolate electrically the sub common wirings 212a-212d and the second common wiring 230. The interlayer dielectric film (not shown) also isolates the sub common wirings from the second common wiring 230 in areas where the sub common wirings 212a-212d and the second common wiring 230 overlap one another.

Referring to FIG. 8, transparent electrically conductive thin films constitute the electrode contacts on the first conductive sides of the first to fourth groups. The transparent electrically conductive thin films include a transparent electrically conductive thin film 232a, a transparent electrically conductive thin film 232b, a transparent electrically conductive thin film 232c, and a transparent electrically conductive thin film 232d. Each of the transparent electrically conductive thin films 232a-232d is common to the single crystal semiconductor thin films that emit light having substantially the same wavelengths, and is isolated from those for the single crystal semiconductor thin films that emit light having different wavelengths.

The transparent electrically conductive thin films 232a-232d serve as electrode contacts for the first conductive side on the surface of the first to fourth groups. The transparent electrically conductive thin films 232a-232d are electrically connected to the surfaces of the sub common wirings 212a-212d, respectively.

Just as in the first embodiment, the substrate 110 of the light emitting apparatus 200 may be implemented with a metal substrate or a low-resistance semiconductor substrate. For example, if the low-resistance semiconductor substrate is used, the metal layer 114 formed on the back surface of the substrate may be used as a common electrode, in which case the metal layer 114 may be formed of Al.

{Operation}

A description will be given of the operation of the invention in which the first group 220 emits red light, the second and third groups 222 and 224 emit green light, and the fourth group emits blue light.

The second common wiring 230, which is common to the first to fourth groups 220, 222, 224, and 226, is connected to the ground. A first voltage Vf1 is applied to the sub common wiring 212a for the first group 220. A second voltage Vf2 is applied to the second common wiring 212b for the second and third groups 222 and 224. A third voltage Vf3 is applied to the sub common wiring 212d for the fourth group 226.

As described above, different voltages are applied to the first to fourth groups, thereby causing the first to fourth groups to emit simultaneously light having different wavelengths. Since the height of the sub common wirings 212a-212d and the second common wiring 230 above the bonding layer 112 are smaller than that of the upper surface of the respective light emitting portions (i.e., the upper surface of the sub common wirings 212a-212d are closer to the substrate 110 than that of the upper surface of the respective light emitting portions), the light emitted in a direction normal to the boding layer 112 and in direction at acute angles with the bonding layer 112 is not significantly blocked.

As described above, the light emitting apparatus according to the second embodiment provides the following advantages in addition to those obtained by the first embodiment. Light emitting portions of a plurality of groups emit light having a plurality of different wavelengths, thereby providing a substantially uniform mixture of different colors of light as a whole.

Modification #2-1

Figure 9A:
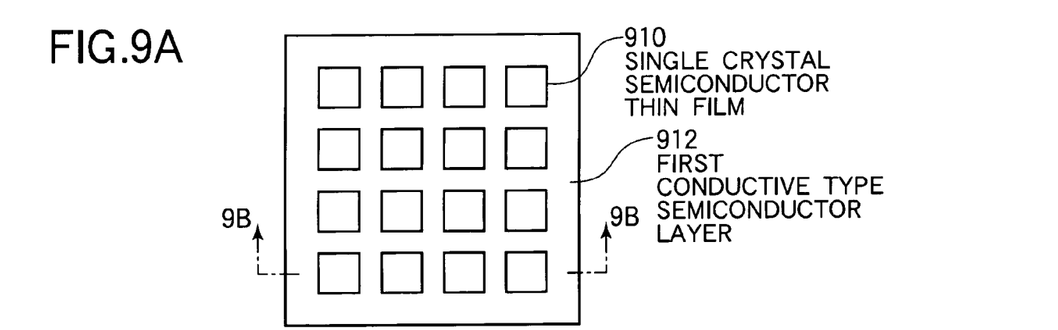
FIG. 9A is a top view of the single crystal semiconductor thin films.
Figure 9B:
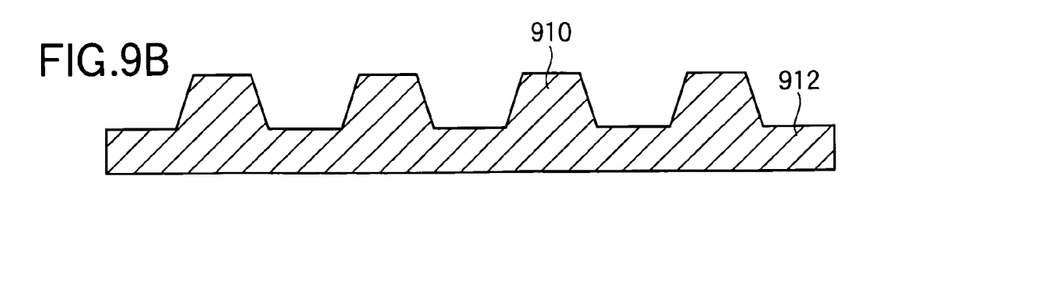
FIG. 9B is a cross-sectional view taken along a line 9B-9B of FIG. 9A.

FIGS. 9A-9B illustrate a plurality of single crystal semiconductor thin films 910 according to modification #2-1 to the second embodiment. FIG. 9A is a top view of the single crystal semiconductor thin films 910. FIG. 9B is a cross-sectional view taken along a line 9B-9B of FIG. 9A. A first conductive type semiconductor layer 912 is in a single piece construction with the single crystal semiconductor thin films 910. The second conductive side electrode contact may be formed on the first conductive type semiconductor layer 912, and the first conductive side electrode contacts may be formed on the upper surface of the single crystal semiconductor thin films 910, on a side of the light emitting portion of the single crystal semiconductor thin films 910 opposite the first conductive type semiconductor layer 912.

Modification #2-2

Figure 10:
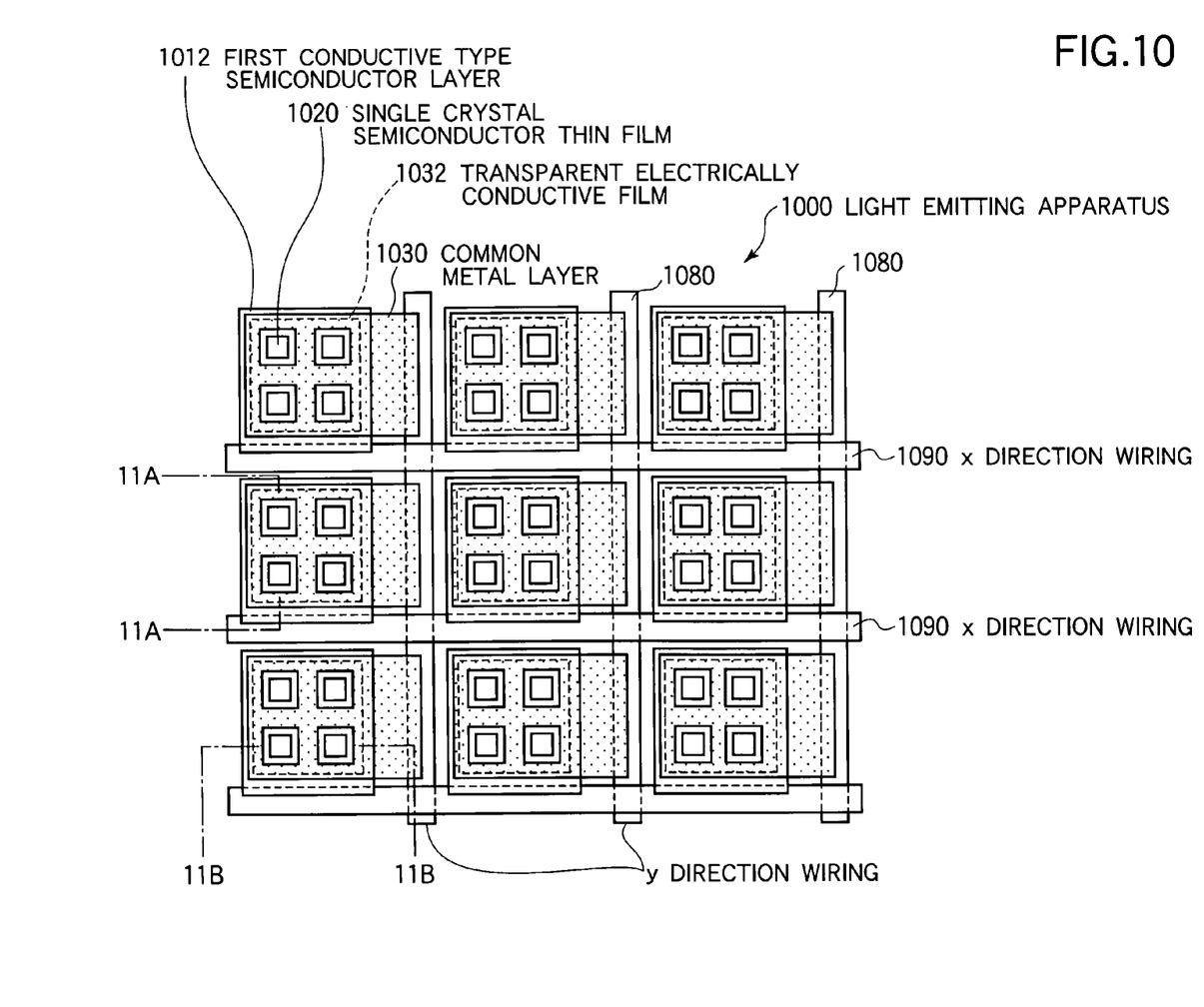
FIG. 10 is a top view of a light emitting apparatus according to a second modification to the second embodiment.
Figure 11A:
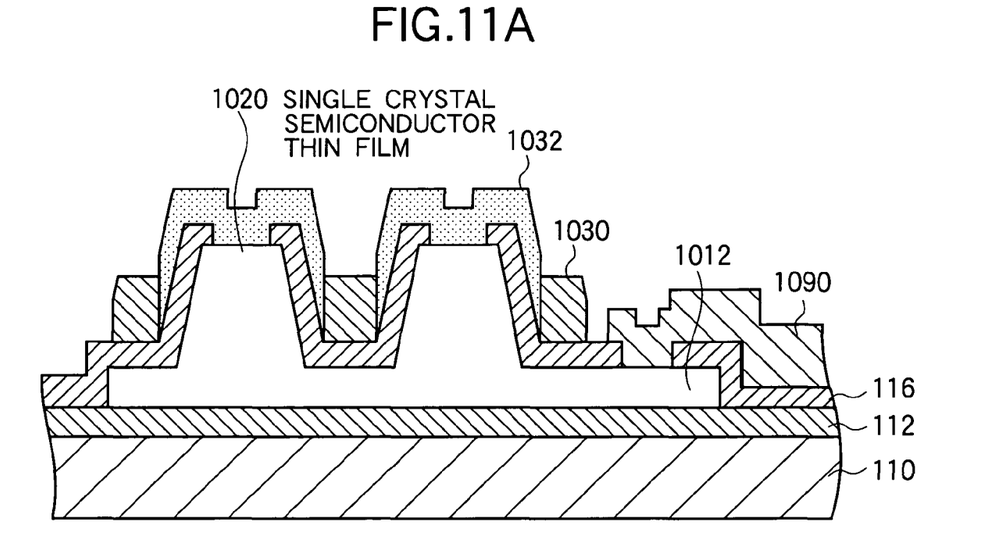
FIG. 11A is a cross-sectional view taken along a line 11A-11A of FIG. 10.
Figure 11B:
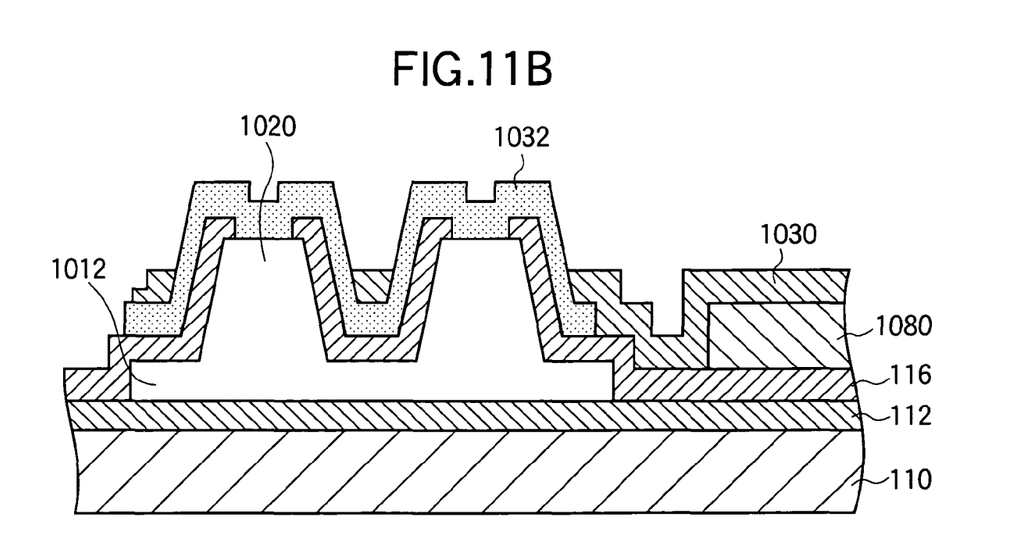
FIG. 11B is a cross-sectional view taken along a line 11B-11B of FIG. 10.

FIG. 10 is a top view of a light emitting apparatus 1000 according to modification #2-2 to the second embodiment. FIG. 11A is a cross-sectional view taken along a line 11A-11A of FIG. 10. FIG. 11B is a cross-sectional view taken along a line 11B-11B of FIG. 10.

The light emitting apparatus 1000 includes a plurality of groups of single crystal semiconductor thin films 1020 (only four of them are shown in one group). A first conductive type semiconductor layer 1012, a transparent electrically conductive film 1032, and a common metal layer 1030 are common to the plurality of single crystal semiconductor thin films 1020 in each group. The common metal layers 1030 are connected to y direction wirings 1080 (FIG. 11B) and the first conductive type semiconductor layer 1012 is connected to x direction wirings 1090 (FIG. 11A). The light emitting apparatus 1000 may be driven to turn on and off by applying control signals to the y direction wiring 1080 and the x direction wiring 1090.

The invention being thus described, it will be obvious that the same may be varied in many ways. Such variations are not to be regarded as a departure from the scope of the invention, and all such modifications as would be obvious to one skilled in the art are intended to be included within the scope of the following claims.

What is claimed is:

1. A light emitting apparatus comprising:
    a substrate;
    a plurality of single crystal semiconductor thin films formed on a surface of the substrate, each of the single crystal semiconductor thin films emitting light when current is passed therethrough;
    a common electrode in contact with top surfaces of the plurality of single crystal semiconductor thin films, the common electrode covering the plurality of single crystal semiconductor thin films from above, the common electrode being electrically conductive and transparent to the light emitted from the plurality of single crystal semiconductor thin films; and
    a common wiring including a plurality of openings formed therein so that each of the single crystal semiconductor thin films is in a corresponding one of the openings, the common wiring being lower than said top surfaces and being directly connected to the common electrode, the common wiring being electrically conductive and blocking the light emitted from the plurality of single crystal semiconductor thin films,
    when viewed perpendicularly to the substrate, the common wiring forms a closed shape around at least one of the single crystal semiconductor thin films so that the at least one of the single crystal semiconductor thin films is within the closed shape.

2. The light emitting apparatus according to claim 1, wherein each of the single crystal semiconductor thin films includes an active layer formed therein, and the common wiring is disposed lower than the active layer.

3. The light emitting apparatus according to claim 1, wherein the substrate is formed of one or more material selected from the group consisting of metal, MN, $Al_2O_3$, Si, and SiC.

4. A light emitting apparatus comprising:
    a substrate;
    a plurality of groups of single crystal semiconductor thin films, each of the groups including:
        a plurality of single crystal semiconductor thin films formed on a surface of the substrate, each of the single crystal semiconductor thin films emitting light when current is passed therethrough;
        a common electrode, that is in contact with top surfaces of the plurality of single crystal semiconductor thin films, the common electrode covering the plurality of single crystal semiconductor thin films from above, the common electrode being electrically conductive and transparent to the light emitted from the plurality of single crystal semiconductor thin films; and
        a common wiring including a plurality of openings formed therein so that each of the single crystal semiconductor thin films is in a corresponding one of the openings, the common wiring being lower than said top surfaces and being directly connected to the common electrode, the common wiring being electrically conductive and blocking the light emitted from the plurality of single crystal semiconductor thin films,
    when viewed perpendicularly to the substrate, the common wiring forms a closed shape around at least one of the single crystal semiconductor thin films so that the at least one of the single crystal semiconductor thin films is within the closed shape.

5. The light emitting apparatus according to claim 1, further including a base through which the single crystal semiconductor thin films are electrically connected to an external power supply.

6. The light emitting apparatus according to claim 4, further including a base through which the single crystal semiconductor thin films are electrically connected to an external power supply.

7. The light emitting apparatus according to claim 1, wherein the single crystal semiconductor thin films are light emitting diodes.

8. The light emitting apparatus according to claim 4, wherein the single crystal semiconductor thin films are light emitting diodes.

9. The light emitting apparatus according to claim 1, wherein said surface of the substrate is a first surface, the common electrode is a first common electrode and the common wiring is a first common wiring, the light emitting apparatus further comprising:
    a second common electrode formed under and in contact with bottom surfaces of the plurality of single crystal semiconductor thin films; and
    a second common wiring formed on a second surface of the substrate opposite the first surface and being connected to the second common electrode.

10. The light emitting apparatus according to claim 4, wherein for each of the groups, the common electrode is a first common electrode, and the common wiring is a first common wiring, the groups each including:
    a second common electrode formed under and in contact with bottom surfaces of the plurality of the single crystal semiconductors thin films; and
    a second common wiring formed on the surface of the substrate and connected to the second common electrode.

11. The light emitting apparatus according to claim 4, wherein each of the single semiconductor thin films includes a first conductivity type semiconductor layer and a second conductivity type semiconductor layer, wherein in each of the groups     the first conductivity type semiconductor layers are connected together and the second conductivity type layers are in contact with the common electrode.

12. The light emitting apparatus according to claim 11, further comprising:

a first wiring connected to the common wirings of the plurality of groups and extending in a first direction; and     a second wiring connected to the first conductivity type semiconductor layers of the plurality of groups and extending in a second direction that forms an angle with the first direction so that the first and second directions are not parallel.

13. The light emitting apparatus according to claim 4, wherein the plurality of groups includes a first and a second group, the first group emitting light of a first wavelength, the second group emitting light of a second wavelength different than the first wavelength.

14. The light emitting apparatus according to claim 13, wherein the common electrode of the first group and the common electrode of the second group are electrically isolated from each other.

\* \* \* \* \*